(12) United States Patent
Wada et al.

(10) Patent No.: US 10,763,845 B2
(45) Date of Patent: Sep. 1, 2020

(54) SEMICONDUCTOR DEVICE

(71) Applicant: Hitachi Automotive Systems, Ltd., Hitachinaka-shi, Ibaraki (JP)

(72) Inventors: Shinichirou Wada, Tokyo (JP); Masahito Sonehara, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 16/314,783

(22) PCT Filed: Jul. 7, 2017

(86) PCT No.: PCT/JP2017/024911
§ 371 (c)(1),
(2) Date: Jan. 2, 2019

(87) PCT Pub. No.: WO2018/042881
PCT Pub. Date: Mar. 8, 2018

(65) Prior Publication Data
US 2019/0260371 A1 Aug. 22, 2019

(30) Foreign Application Priority Data
Sep. 1, 2016 (JP) .................. 2016-170716

(51) Int. Cl.
*H03K 17/082* (2006.01)
*H01L 27/02* (2006.01)
(Continued)

(52) U.S. Cl.
CPC ....... *H03K 17/0822* (2013.01); *H01L 21/822* (2013.01); *H01L 27/0251* (2013.01);
(Continued)

(58) Field of Classification Search
None
See application file for complete search history.

(56) References Cited

U.S. PATENT DOCUMENTS

| 4,893,158 A | 1/1990 | Mihara et al. |
| 5,616,950 A | 4/1997 | Liu |

(Continued)

FOREIGN PATENT DOCUMENTS

| JP | 63-318781 A | 12/1988 |
| JP | 6-342803 A | 12/1994 |

(Continued)

OTHER PUBLICATIONS

International Search Report (PCT/ISA/210) issued in PCT Application No. PCT/JP2017/024911 dated Oct. 31, 2017 with English translation (four (4) pages).

(Continued)

*Primary Examiner* — Lincoln D Donovan
*Assistant Examiner* — Khareem E Almo
(74) *Attorney, Agent, or Firm* — Crowell & Moring LLP

(57) ABSTRACT

A semiconductor device capable of enhancing uniformity of temperatures of transistors in an active clamp state while maintaining current performance is provided. A power transistor is connected to a power transistor in parallel. An active clamp circuit is provided in a path from a connection point between the power transistors to a gate of the power transistor and is conducted in a case where a voltage of the connection point exceeds a first threshold. An active clamp cutoff circuit is provided in a path from the active clamp circuit to a gate of the power transistor and cuts off or suppresses a current flowing into the path.

11 Claims, 10 Drawing Sheets

(51) Int. Cl.
*H01L 27/04* (2006.01)
*H03K 17/0814* (2006.01)
*H01L 21/822* (2006.01)
*H03K 17/08* (2006.01)

(52) U.S. Cl.
CPC ......... *H01L 27/04* (2013.01); *H03K 17/0814* (2013.01); *H03K 2017/0806* (2013.01)

(56) References Cited

U.S. PATENT DOCUMENTS

| | | | | |
|---|---|---|---|---|
| 7,809,864 | B1* | 10/2010 | Young | G06F 1/266 |
| | | | | 326/83 |
| 8,587,362 | B2* | 11/2013 | Machida | H03K 17/0822 |
| | | | | 327/427 |
| 2009/0166671 | A1* | 7/2009 | Hwang | H01L 27/0262 |
| | | | | 257/137 |
| 2015/0145583 | A1* | 5/2015 | Hayashi | H03K 3/013 |
| | | | | 327/321 |
| 2016/0173084 | A1* | 6/2016 | Huang | H03K 17/687 |
| | | | | 361/91.5 |
| 2016/0372457 | A1* | 12/2016 | Reinprecht | H02H 9/046 |
| 2017/0346274 | A1* | 11/2017 | Nakahara | H03K 17/0822 |
| 2019/0036445 | A1* | 1/2019 | Muto | H03K 17/08142 |
| 2019/0260371 | A1* | 8/2019 | Wada | H01L 27/04 |

FOREIGN PATENT DOCUMENTS

| | | |
|---|---|---|
| JP | 10-256541 A | 9/1998 |
| JP | 2001-85618 A | 3/2001 |
| JP | 2006-352931 A | 12/2006 |
| JP | 2008-35067 A | 2/2008 |
| JP | 2008-182122 A | 8/2008 |
| JP | 2014-216703 A | 11/2014 |
| WO | WO 97/45957 A1 | 12/1997 |

OTHER PUBLICATIONS

Japanese-language Written Opinion (PCT/ISA/237) issued in PCT Application No. PCT/JP2017/024911 dated Oct. 31, 2017 (six (6) pages).

* cited by examiner (COMPARATIVE EXAMPLE)

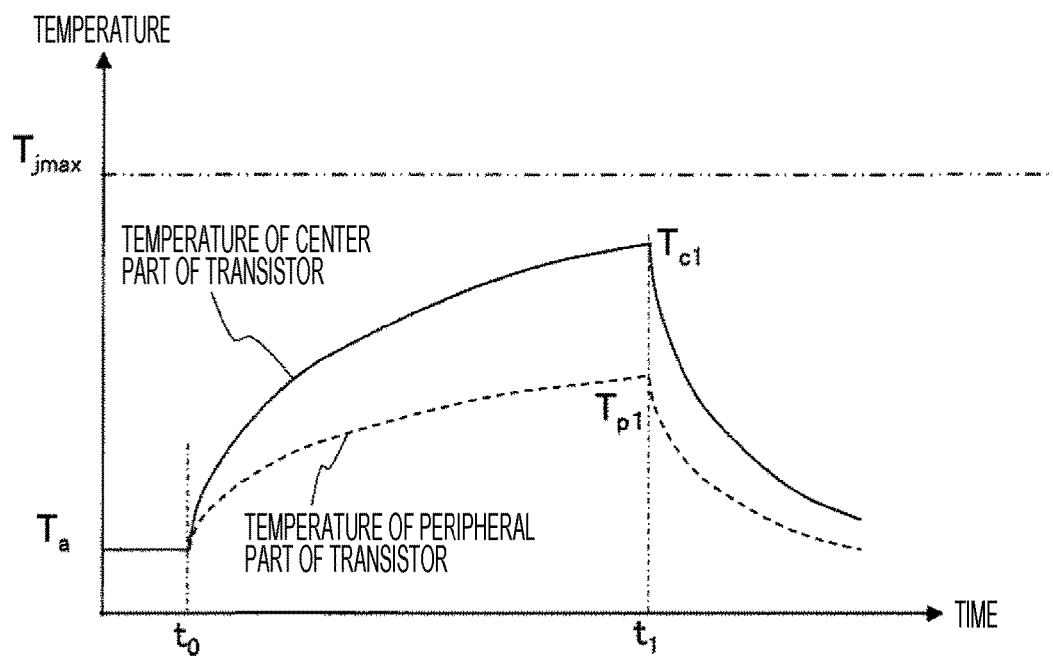

SEMICONDUCTOR DEVICE

TECHNICAL FIELD

The present invention relates to a semiconductor device.

BACKGROUND ART

A semiconductor device including a drive circuit such as a solenoid load to be mounted in an in-vehicle electrical control unit (ECU) is required to have a high breakdown voltage of equal to or higher than 30 V and a current drive ability with high ampere order and to absorb current energy generated at an output terminal so as not to cause malfunction and destruction of an element of a power transistor. Therefore, there is a method of providing active clamp circuits at a gate and a drain of a power transistor of an output stage (for example, refer to PTL 1). As a result, the current energy generated at the output terminal can be discharged to the ground.

Here, current energy (thermal breakdown energy) which can be consumed by a power transistor at the time of an active clamping operation is determined based on an occurrence condition of thermal runaway caused by self-heating of the transistor, and the value of the current energy can be increased by increasing a size of the transistor in general. However, there is a problem such that the increase in the size of the transistor increases chip cost.

On the other hand, in a relatively large power transistor, since heat dissipation properties of a center region and a peripheral region are different from each other, temperatures of the center region and the peripheral region are different from each other. That is, although the temperature is high in the center region with poor heat dissipation properties, the temperature is low in the peripheral region due to the heat dissipation effect. As a result, there are problems such that the thermal breakdown energy of the transistor cannot be increased by a corresponding amount and that the amount of the allowable energy is restricted to be small and the use environment temperature of the transistor cannot be set to be high so that the junction temperature of the transistor does not exceed the rated temperature from the viewpoint of reliability.

To solve these problems, techniques are disclosed for uniforming the temperature distribution in the transistor. One of the techniques is a method in which intervals between active regions of transistors arranged in parallel are widened in the center region and are narrowed in the peripheral region (for example, refer to PTL 2), and another method is a method of reducing an input power in the center region to be lower than an input power in the peripheral region. In either method, the temperature distribution in the transistor can be uniformed by decreasing the power consumption per unit area from the peripheral region toward the center region, and as a result, the thermal breakdown energy of the transistor can be increased.

Furthermore, a technique is disclosed in which a non-active region is provided in the center region of the power transistor and a heat radiation electrode is formed on the non-active region (for example, refer to PTL 3). By deactivating the center region where the temperature rises, the temperature in the transistor can be reduced, and the uniformity of the temperature can be enhanced. Furthermore, the temperature can be further lowered by radiating heat to the outside of a semiconductor via the heat radiation electrode. As a result, the thermal breakdown energy of the transistor can be increased.

Furthermore, a technique is disclosed in which, in a semiconductor integrated circuit having an overtemperature detection circuit for detecting whether the temperature of the power transistor is equal to or higher than a predetermined temperature, when the temperature of the transistor becomes equal to or higher than the predetermined temperature, the transistor is not driven, and the power transistor is set to be an active clamp state with a second clamp voltage lower than a first clamp voltage (for example, refer to PTL 4). Since it is possible to suppress a rapid increase in the temperature of the transistor by lengthening a time when surge energy is consumed, temperature setting for detecting an overtemperature can be closer to the maximum operation guarantee temperature. As a result, the transistor can be operated at a higher temperature.

CITATION LIST

Patent Literature

PTL 1: JP 2008-35067 A
PTL 2: JP 6-342803 A
PTL 3: JP 2008-182122 A
PTL 4: JP 2001-85618 A

SUMMARY OF INVENTION

Technical Problem

However, according to the technique disclosed in PTL 2, the intervals between the active regions and the shapes of the transistor in the center region are different from those of the transistor in the peripheral region so that consumed power density of each transistor is decreased from the peripheral region toward the center region. Therefore, there is a problem in that performance of the transistor per area is decreased in the center region at the time of normal operation. Furthermore, there is a problem in that a structure design of the transistor is complicated since it is necessary to change the shape of the transistor.

With the method disclosed in PTL 3, the uniformity of the temperature of the transistor can be enhanced. However, to make the current performance of each transistor at the time of normal operation be the same, there is a problem in that the size of the transistor increases by a size of the non-active region in comparison with a case where the non-active region is not provided.

Furthermore, according to the method disclosed in PTL 4, by lowering the clamp voltage at the time when the overtemperature is detected without deteriorating the current performance of the transistor per area at the time of the normal operation, a rapid increase in the temperature can be suppressed, and the thermal breakdown energy can be increased. On the other hand, a problem still remains in that the junction temperature of the transistor in the center part is higher than that in the peripheral part in the active clamp state, and there is a problem in that an amount of the current energy is restricted so that the junction temperature of the transistor in the center part does not exceed the maximum rated temperature. In addition, there is a problem in that a time of the active clamping operation increases because the time when the current energy is consumed is lengthened.

An object of the present invention is to provide a semiconductor device capable of enhancing uniformity of a temperature of a transistor in an active clamp state while maintaining current performance.

Solution to Problem

To achieve the above object, the present invention includes a first transistor including a first control electrode, a second transistor connected to the first transistor in parallel and including a second control electrode, an active clamp circuit which is provided in a first path from a first connection point between the first transistor and the second transistor to the first control electrode and is conducted in a case where a voltage of the first connection point exceeds a first threshold, and an active clamp cutoff circuit which is provided in a second path from the active clamp circuit to the second control electrode and cuts off or suppresses a current flowing into the second path.

Advantageous Effects of Invention

According to the present invention, uniformity of a temperature of a transistor in an active clamp state can be enhanced while maintaining current performance. A problem, a structure, and an effect other than those described above will be clarified in the embodiments below.

BRIEF DESCRIPTION OF DRAWINGS

FIG. 11 is a diagram illustrating a temporal transition of a temperature in a transistor at the time of an active clamping operation of the load drive circuit illustrated in FIG. 10.

DESCRIPTION OF EMBODIMENTS

Figure 1:
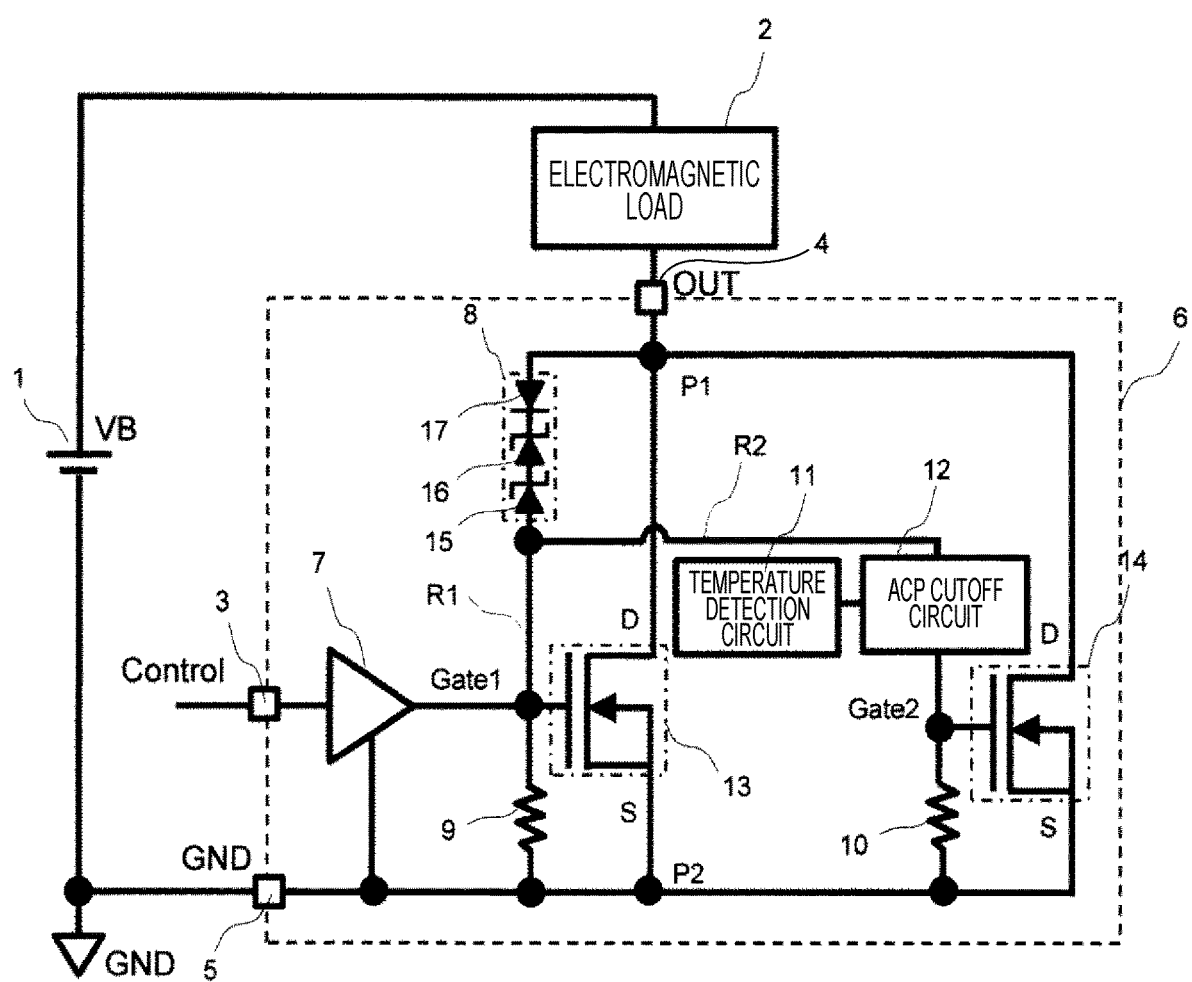
FIG. 1 is a circuit diagram of a load drive circuit according to a first embodiment.

Hereinafter, configurations and operations of load drive circuits (semiconductor device) according to the first to fourth embodiments of the present invention will be described with reference to the drawings. In each of the drawings, the same reference numeral indicates the same part. The load drive circuit according to the embodiments of the present invention has been made to achieve, for example, the following first and second objects which partially overlap with the object described above.

The first object is to enhance uniformity of a temperature of a transistor at the time of an active clamp, and to increase thermal breakdown energy of the transistor and allowable energy so that the temperature of the transistor does not exceed a rated temperature, without increasing a size of the transistor and deteriorating current performance of the transistor per area at the time of normal operation.

The second object is to operate the transistor under a high-temperature environment by improving the uniformity of the temperature of the transistor at the time of the active clamping operation without increasing the active clamp time.

Comparative Example

Figure 10:
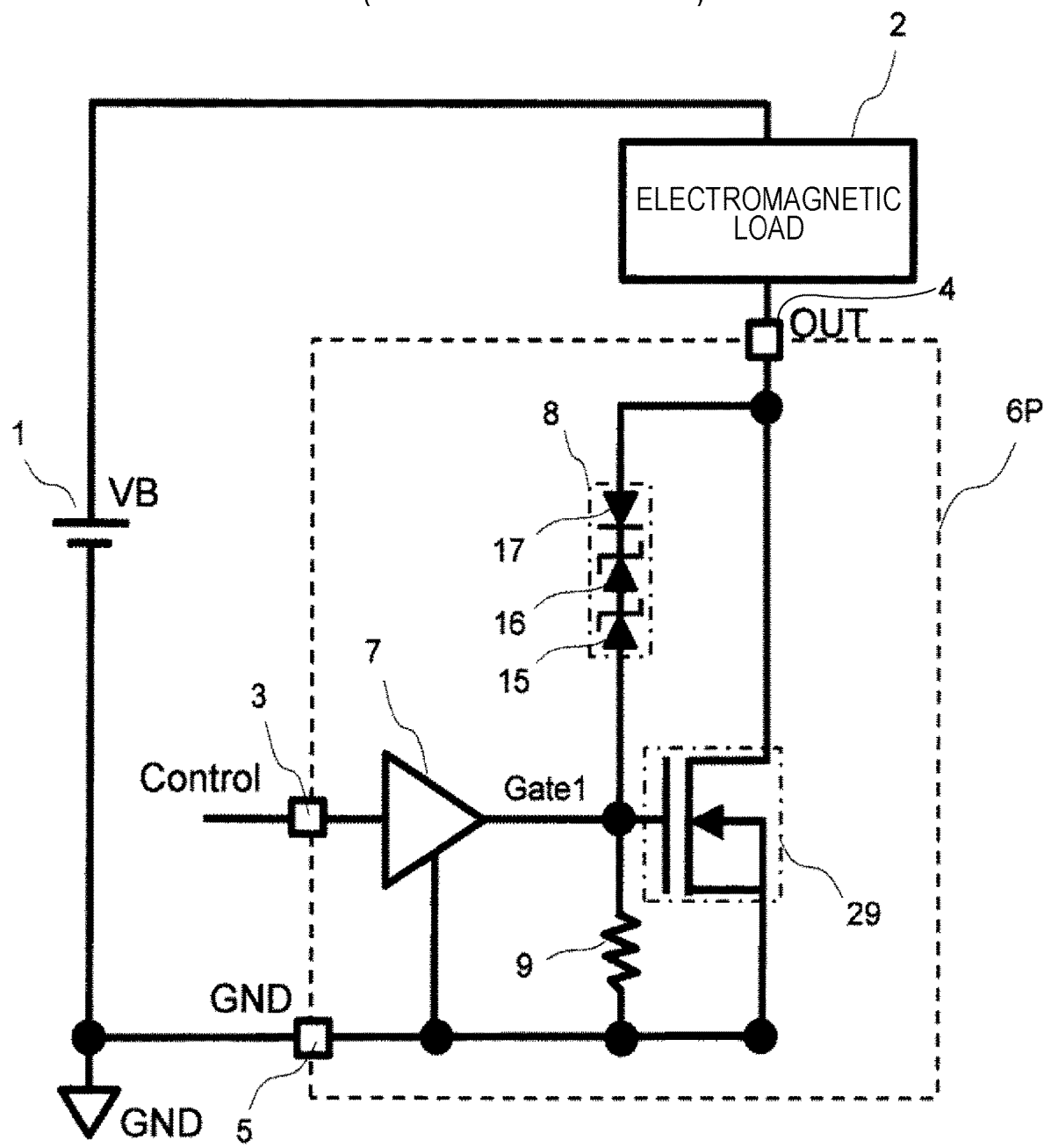
FIG. 10 is a circuit diagram of a load drive circuit according to a comparative example.

First, with reference to FIG. 10, a configuration and a basic operation of a load drive circuit 6P having an active clamp circuit 8 which is a comparative example of the embodiments of the present invention will be briefly described.

When a voltage exceeding an absolute maximum rating is generated at an output terminal 4 due to discharge of large inductive current energy from an electromagnetic load (inductive load) and current noise, avalanche breakdown occurs in zener diodes 15 and 16, a current flows in the active clamp circuit 8, the current flows in a gate resistor 9 connected between a source and a gate of a power transistor 29, and this turns on the power transistor 29 (active clamping operation). As a result, current energy generated at the output terminal 4 can be discharged to the ground.

First Embodiment

FIGS. 1 to 5 illustrate an embodiment of the present invention, which will be described below.

FIG. 1 is a circuit diagram of a load drive circuit 6 (semiconductor device) according to a first embodiment. The load drive circuit 6 includes a power transistor 13 including a first-group MOSFETs (semiconductor element) formed on a semiconductor substrate and a power transistor 14 including a second-group MOSFETs. A source of the power transistor 13 including the first-group MOSFETs is electrically connected to a source of the power transistor including the second-group MOSFETs. A drain of the power transistor 13 including the first-group MOSFETs is electrically connected to a drain of the power transistor 14 including the second-group MOSFETs.

In other words, the power transistor 14 (second transistor) is connected to the power transistor 13 (first transistor) in parallel.

The gate resistor 9 is connected between a gate and a source of the power transistor 13 including the first-group MOSFETs, and the active clamp circuit 8 is connected between the gate and the drain. In addition, a gate resistor 10 is connected between a gate and a source of the power transistor 14 including the second-group MOSFETs, and active clamp (ACP) cutoff circuit 12 is connected between the gate and the active clamp circuit 8.

In other words, the active clamp circuit 8 is provided in a path R1 (first path) from a connection point P1 (first connection point) between the power transistor 13 (first transistor) and the power transistor 14 (second transistor) to the gate (first control electrode) of the power transistor 13, and is conducted in a case where a voltage of the connection point P1 exceeds a first threshold. The gate resistor 9 (first resistor) is connected between a connection point P2 (second connection point) between the power transistors 13 and 14 and the gate (first control electrode) of the power transistor 13. Furthermore, the gate resistor 10 (second resistor) is connected between the connection point P2 and the gate (second control electrode) of the power transistor 14. The active clamp cutoff circuit 12 is provided in a path R2

(second path) from the active clamp circuit 12 to the gate (second control electrode) of the power transistor 14 and cuts off or suppresses a current flowing into the path R2.

The active clamp circuit 8 includes a reverse current blocking diode 17 and the zener diodes 15 and 16 connected in series. Furthermore, the active clamp cutoff circuit 12 is connected to a temperature detection circuit 11 for detecting the temperatures of the power transistors 13 and 14.

Figure 4:
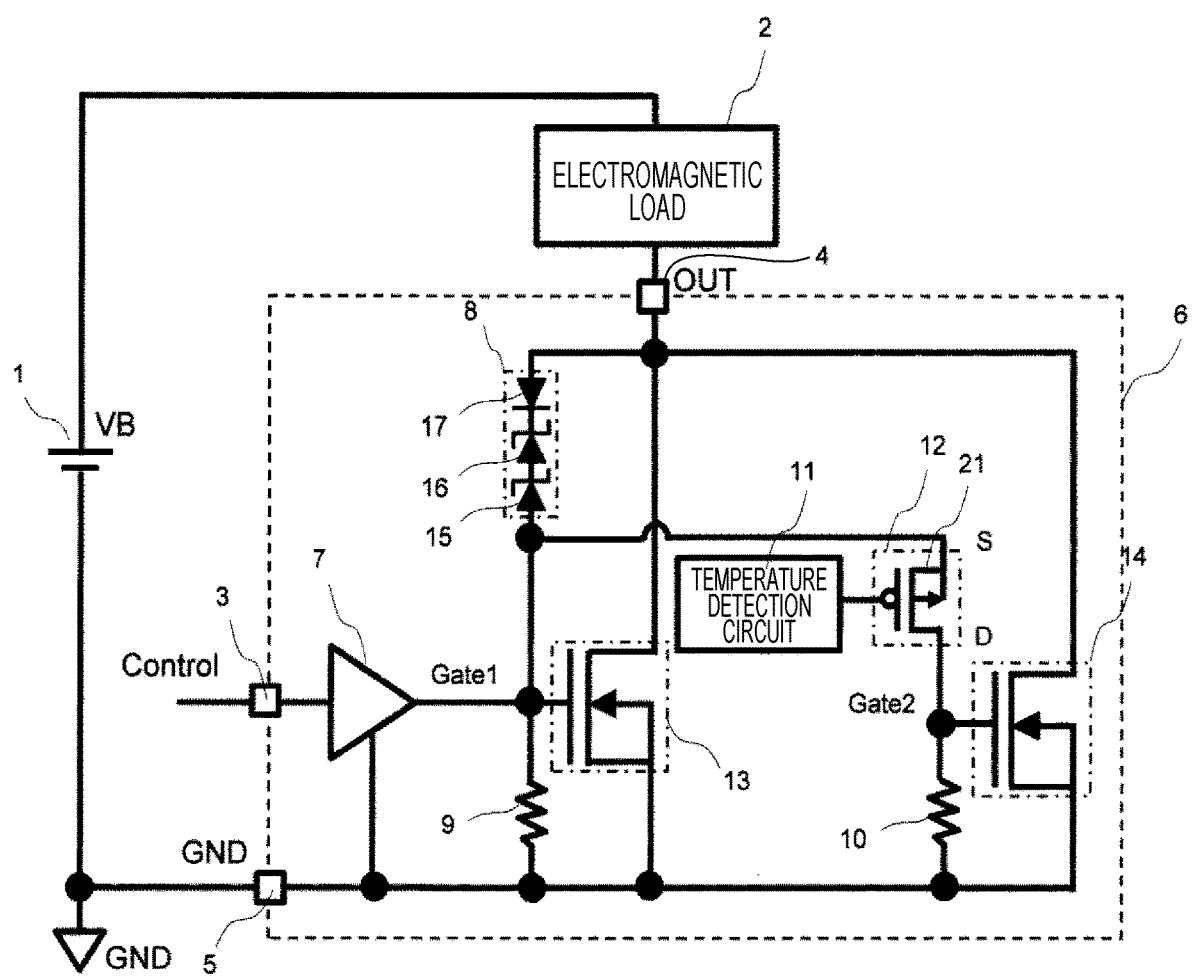
FIG. 4 is a circuit diagram of a configuration of an active clamp cutoff circuit illustrated in FIG. 1.

As illustrating an example of the active clamp cutoff circuit 12 in FIG. 4, the active clamp cutoff circuit 12 includes a PMOS transistor 21, and a source is connected to the active clamp circuit 8, a drain is connected to the gate of the power transistor 14, and a gate is connected to the temperature detection circuit 11. The temperature detection circuit 11 normally outputs LOW, the PMOS transistor 21 is turned on, and the active clamp circuit 8 and the gate of the power transistor 14 are electrically connected to each other.

Figure 5:
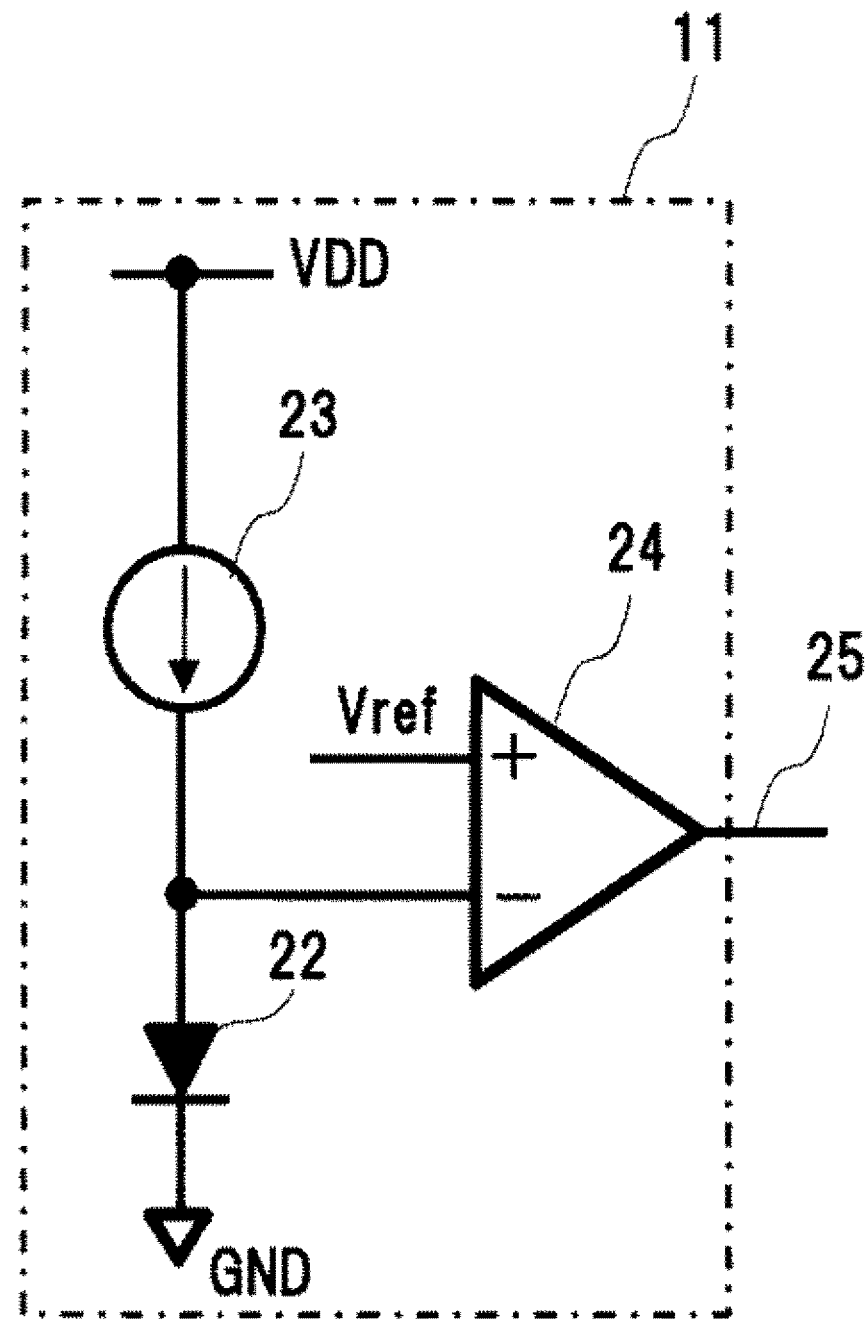
FIG. 5 is a circuit diagram of a temperature detection circuit illustrated in FIG. 1.

As illustrating an example of the temperature detection circuit 11 in FIG. 5, a thermal diode 22 for detecting the temperatures of the power transistors 13 and 14 is connected to a current source 23 and a comparator 24. A forward voltage $V_f$ of the diode decreases as the temperature increases, and when the forward voltage $V_f$ falls below a predetermined determination voltage $V_{ref}$ (reference voltage), an output of the comparator 24 is changed from LOW to High. To enhance thermal response, it is desirable that the thermal diode 22 be arranged in or near the power transistor 14.

In other words, the temperature detection circuit 11 detects the temperature of the power transistor 14 (second transistor). The active clamp cutoff circuit 12 includes the PMOS transistor 21 (third transistor) which is turned on in a case where the temperature of the power transistor is equal to or lower than a second threshold and is turned off in a case where the temperature of the power transistor 14 exceeds the second threshold.

Figure 2:
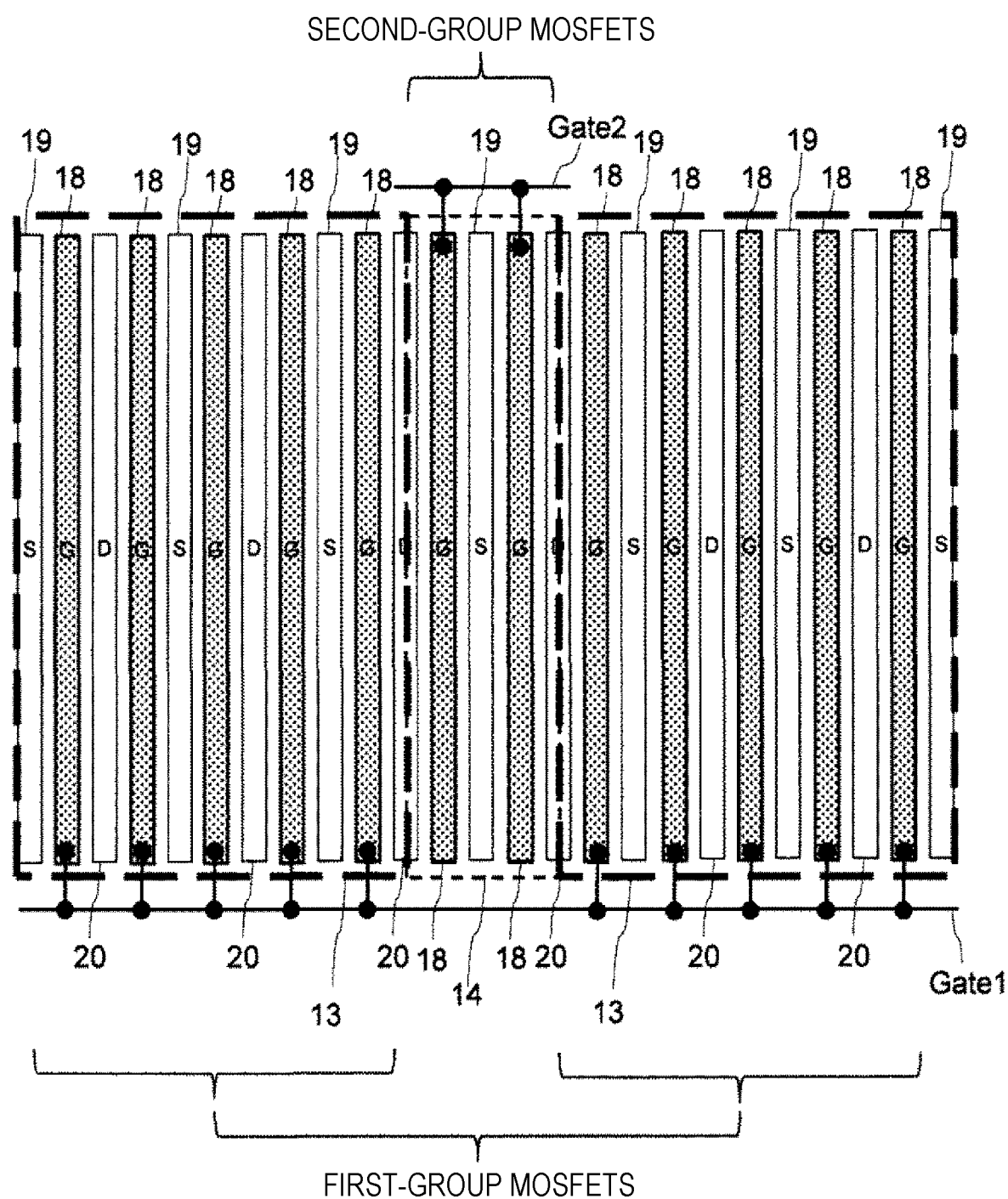
FIG. 2 is a plan structural diagram of a power transistor illustrated in FIG. 1.

Next, planar structures of the power transistor 13 including the first-group MOSFETs and the power transistor including the second-group MOSFETs are illustrated in FIG. 2. The power transistor includes a plurality of MOSFETs. The second-group MOSFETs include MOSFETs positioned in the center part, and the first-group MOSFETs include MOSFETs which are positioned in the non-center part.

In other words, the power transistor 13 (first transistor) is formed in a first region (region surrounded by a thick broken line illustrated in FIG. 2) on the semiconductor substrate. The power transistor 14 (second transistor) is formed in a second region (region surrounded by a thin broken line illustrated in FIG. 2) adjacent to the first region. Specifically, the first region includes two regions adjacent to the second region. The second region is positioned in a center part of the semiconductor substrate. Note that the temperature of the power transistor 14 in a case where the power transistor 14 is turned on is higher than the temperature of the power transistor 13 in a case where the power transistor 13 is turned on.

Although not illustrated in FIG. 2, sources 19 are electrically connected to each other by a wiring layer (for source), and drains 20 are electrically connected to each other by a wiring layer (for drain). Gates 18 of the first-group MOSFETs are connected to each other by a wiring layer Gate1, and gates 18 of the second-group MOSFETs are connected to each other by a wiring layer Gate2.

Subsequently, an operation of the load drive circuit 6 illustrated in FIG. 1 will be described. At the time of the normal operation not in an active clamp state, the active clamp cutoff circuit 12 is conducted, the gate (wiring layer Gate1) of the power transistor 13 including the first-group MOSFETs is electrically connected to the gate (wiring layer Gate2) of the power transistor 14 including the second-group MOSFETs, a control signal input to an input terminal 3 is supplied to the wiring layers Gate1 and Gate2 via a buffer 7, and the gates of the power transistors 13 and 14 are driven at the same voltage. Therefore, current performance per area of the power transistor 13 including the first-group MOSFETs and that of the power transistor 14 including the second-group MOSFETs are equal to each other, which is equal to current performance per area of the power transistor 29 of the comparative example illustrated in FIG. 10.

Next, in a case where the voltage of the output terminal 4 becomes equal to or higher than a predetermined voltage due to current noise and current energy discharge from the electromagnetic load, breakdown of the zener diodes 15 and 16 causes the current to flow into the active clamp circuit 8. By flowing this current into the gate resistor 9 connected to the gate of the power transistor 13 including the first-group MOSFETs, a voltage of the gate increases, and the power transistor 13 is driven. This state is referred to as an active clamp state, and a drain voltage of the transistor is clamped to a desired voltage (clamping voltage).

On the other hand, since the current from the active clamp circuit 8 flows into the gate resistor 10 connected to the gate of the power transistor 14 including the second-group MOSFETs, the gate voltage increases, the power transistor 14 is driven, and the active clamp state is similarly generated.

At this time, since relatively large power which is applied by a product of a drain current and a clamp voltage is consumed in the power transistors 13 and 14, a junction temperature is increased by self-heating with time. FIG. 11 illustrates a temporal change of the temperature in the transistor at the time of active clamp according to the comparative example. Under a condition in which a power density is constant, regarding temperature distribution in the transistor, the temperature of the center part of the transistor is the highest, and the temperature of the peripheral part is low ($T_{C1} > T_{p1}$) due to a difference of a heat dissipation effect. On the other hand, since it is necessary for the temperature of the transistor not to exceed a rated temperature Tjmax, an amount of energy and a use environment temperature Ta at the time of the active clamp are limited so as to satisfy $T_{jmax} > T_{C1}$.

Figure 3:
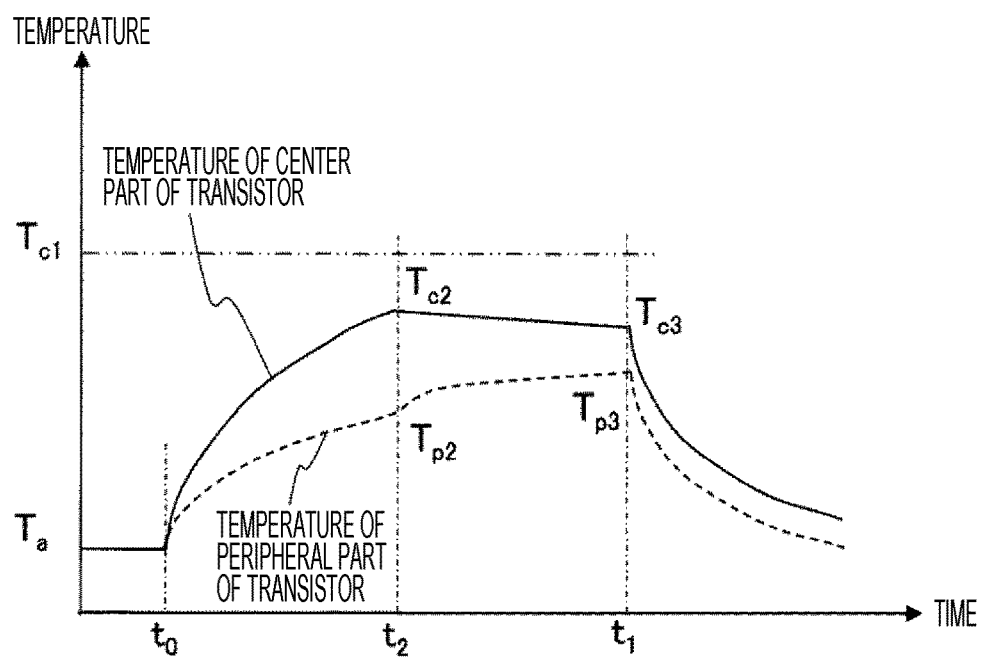
FIG. 3 is a diagram illustrating a temporal transition of a temperature in a transistor at the time of an active clamping operation of the load drive circuit illustrated in FIG. 1.

FIG. 3 illustrates a temporal change of the temperature in the transistor at the time of the active clamp in the first embodiment of the present invention. A temperature change immediately after start (t0) of the active clamping operation is not different from the comparative example (refer to FIG. 11). However, when the temperature detection circuit 11 detects that the temperature of the power transistor 14 including the MOSFETs in the center part exceeds a predetermined temperature, the active clamp cutoff circuit 12 is operated, the active clamp circuit 8 including the MOSFETs in the center part is not electrically connected to the gate of the power transistor 14, and the power transistor 14 is not driven.

On the other hand, the active clamp state of the power transistor 13 including the MOSFETs in a non-center part is continued. As a result, heat generation in only the power transistor 14 in the center part is suppressed, and decrease or increase in the temperature of the center part of the transistor is suppressed. However, since the heat generation of the power transistor 13 in the non-center part is continued, the temperature of the transistor in the non-center part continuously increases.

As a result, a difference between the temperature of the center part of the transistor ($T_{c3}$) and the temperature of the peripheral part ($T_{p3}$) decreases, and uniformity of the temperature of the transistor is enhanced. In addition, the maximum temperature of the transistor at the time of the active clamp can be lower than the comparative example (refer to FIG. 11) ($T_{C2} < T_{C1}$ and $T_{C3} < T_{C1}$). Therefore, the use environment temperature Ta can be increased. Furthermore, under the same condition of the use environment temperature Ta, the power transistor can consume more energy at the time of the active clamp. In addition, with this effect, a thermal breakdown resistance of the power transistor with respect to the current energy can be improved, and thermal breakdown energy can be raised.

In the present embodiment, MOS transistors are used as the power transistors 13 and 14. However, semiconductor elements (IGBT) can be used, and the operation of the transistor at that time is similar to a case of the MOS transistor.

In the present embodiment, the power transistor 13 includes the first-group MOSFETs in the non-center part, and the power transistor 14 includes the second-group MOSFETs in the center part. However, the present invention is not limited to this. Even when the second-group MOSFETs included in the power transistor 14 are separately formed (arranged) in a plurality of regions of which the center part is weighted, the uniformity of the temperature of the power transistor at the time of the active clamp can be enhanced.

As described above, according to the present embodiment, while maintaining current performance, the uniformity of the temperature of the transistor in the active clamp state can be enhanced.

More specifically, without increasing the size of the transistor and without deteriorating the current performance of the transistor per area at the time of the normal operation, increase in the temperature of the center part of the transistor at the time of the active clamping operation is suppressed, and the uniformity of the junction temperature in the transistor is enhanced. Accordingly, the thermal breakdown energy of the transistor and allowable energy within a range not exceeding the rated temperature of the transistor can be increased.

Furthermore, by suppressing the increase in the junction temperature of the center part of the transistor at the time of the active clamping operation and making temperature setting to detect overtemperature be closer to the maximum operation guarantee temperature without increasing the active clamp time, the transistor can be operated at a higher temperature.

Second Embodiment

Figure 6:
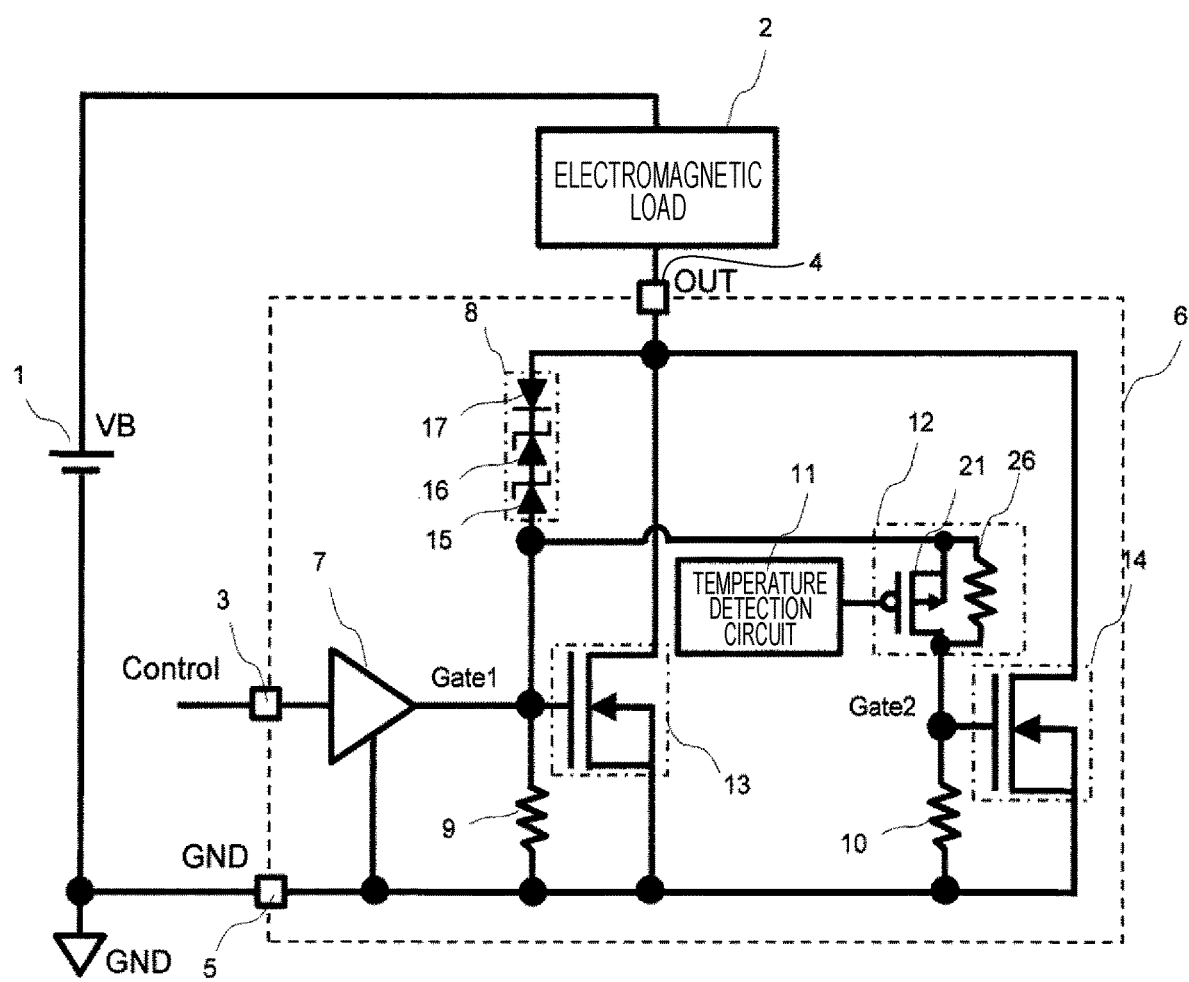
FIG. 6 is a circuit diagram of a load drive circuit according to a second embodiment.

FIG. 6 illustrates a circuit diagram according to a second embodiment of the present invention. The second embodiment is different from the first embodiment in that the active clamp cutoff circuit 12 includes the PMOS transistor 21 and a gate voltage reducing resistor 26 (resistor) connected to the PMOS transistor 21 in parallel. At the time of the normal operation which is a non-active clamp state, the PMOS transistor 21 is turned on, and the active clamp circuit 8 is connected to the gate of the power transistor 14 with low impedance. Therefore, an operation state is similar to that in the first embodiment.

On the other hand, in a case where the temperature detection circuit 11 outputs High and the PMOS transistor is turned off in the active clamp state, the active clamp circuit 8 and the gate (wiring layer Gate2) of the power transistor 14 are connected to each other via the gate voltage reducing resistor 26.

As a result, a gate voltage of the power transistor 14 is determined based on a voltage division ratio of the gate voltage reducing resistor 26 and the gate resistor 10, and the gate voltage is smaller than that in a case where the PMOS transistor is turned on. As a result, the drain current of the power transistor 14 in the center part is reduced, and the power consumption per area is smaller than the power transistor 13 in the non-center part. As a result, the uniformity of the temperatures of the power transistors 13 and 14 can be enhanced, and the effect similar to the first embodiment can be obtained. However, since the drain current of the power transistor 14 in the center part at the time of the active clamp can be freely adjusted by adjusting a resistance value of the gate voltage reducing resistor 26, the uniformity of the temperature of the transistor at the time of the active clamp can be more enhanced as compared with the first embodiment.

Third Embodiment

Figure 7:
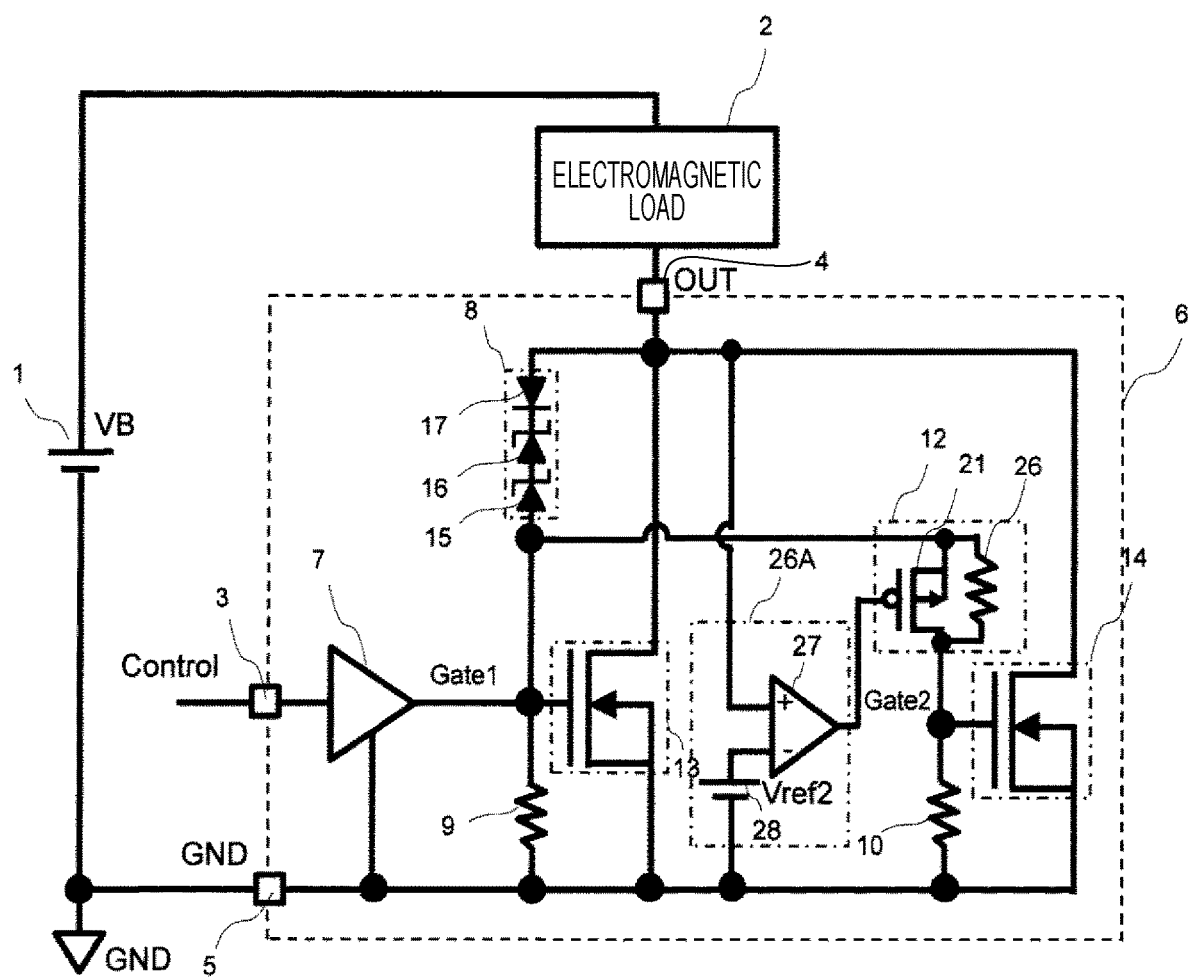
FIG. 7 is a circuit diagram of a load drive circuit according to a third embodiment.

FIG. 7 illustrates a circuit diagram according to a third embodiment of the present invention. The third embodiment is different from the second embodiment in that the temperature detection circuit 11 (FIG. 6) is replaced with an active clamp detection circuit 26A (FIG. 7). At the time of the normal operation which is a non-active clamp state, the PMOS transistor 21 is turned on, and the active clamp circuit 8 is connected to the gate of the power transistor 14 with low impedance. Therefore, an operation state is similar to that in the first embodiment.

The active clamp detection circuit 26A includes a comparator which receives a voltage of the output terminal 4 and a determination voltage source 28. When the voltage of the output terminal 4 exceeds a determination voltage $V_{ref2}$, an output of the active clamp detection circuit 26A is in a High state, and the PMOS transistor 21 of the active clamp cutoff circuit 12 is turned off.

In other words, the active clamp detection circuit 26A detects an active clamp state indicating a state where the active clamp circuit 8 is conducted. The active clamp cutoff circuit 12 includes the PMOS transistor 21 (third transistor) which is turned on when the active clamp state is not detected, and is turned off when the active clamp state is detected.

As a result, the active clamp circuit 8 and the gate of the power transistor 14 in the center part are connected to each other via the gate voltage reducing resistor 26, and as in the second embodiment, the resistance-divided gate voltage is applied to the power transistor 14. Therefore, the drain current of the power transistor 14 in the center part is reduced, and the power consumption per area is smaller than the power transistor 13 in the non-center part. As a result, the uniformity of the temperatures of the power transistors 13 and 14 can be enhanced, and the effect similar to the second embodiment can be obtained. However, in comparison with the second embodiment using the temperature detection circuit, immediately after the start of the active clamping operation, power consumption of the power transistor 14 in the center part per area is smaller than power consumption of the power transistor 13 in the non-center part per area, and the uniformity of the temperatures of the power transistors 13 and 14 at the time of the active clamp can be more enhanced.

Note that input of the comparator 27 in the active clamp detection circuit 26A is not necessarily an output terminal 4, and a cathode voltage of the zener diode 15 or 16 can be used. In addition, it is possible to detect a voltage drop of a resistor element at the time when a desired current flows into the active clamp circuit 8 by connecting the resistance element (sense resistor and the like) to the active clamp circuit 8.

Fourth Embodiment

Figure 8:
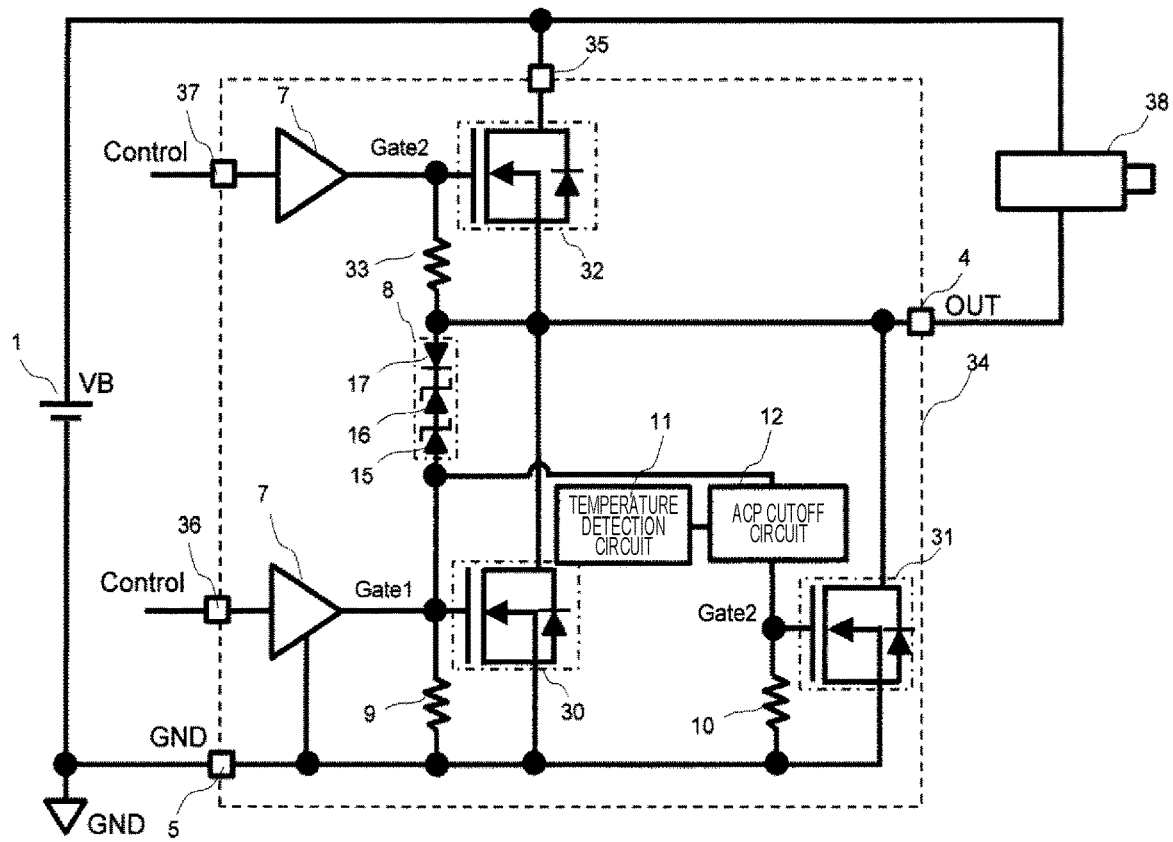
FIG. 8 is a circuit diagram of a load drive circuit according to a fourth embodiment.

FIG. 8 illustrates a load drive circuit 34 which uses the load drive circuit according to the first embodiment on a low side and drives a solenoid 38 including a high side transistor 32 and low side transistors 30 and 31. A PWM control signal is input through a low side input terminal and a high side input terminal 37, and current for driving the solenoid 38 flows through the output terminal 4 at the time of normal operation. When a current amount is increased, the low side transistors 30 and 31 are turned on, and when the current amount is decreased, the high side transistor 32 is turned on. However, there is a period when both transistors are turned off so that both transistors are not turned on at the same time. At this time, the current flowing through the solenoid 38 flows from the output terminal 4 through a power supply terminal 35 via a diode connected to the high side transistor 32 in parallel, and flows into the solenoid 38 in a circulation state.

Here, in the circulation state, in a case where an abnormality occurs in which the power supply terminal 35 and a power source 1 are opened (load dump state) for some reason, there is no place where the current flowing through the solenoid 38 flows. Therefore, the voltage of the output terminal 4 increases and exceeds a power supply voltage VB. When the voltage of the output terminal 4 becomes equal to or higher than breakdown voltages of the zener diodes 15 and 16, current flows from the output terminal 4 to the zener diodes 15 and 16, and the current flows into the gate resistors 9 and 10 of the low side transistors 30 and 31. Accordingly, before the voltage of the output terminal 4 becomes a withstand voltage between the source and the drain of the low side transistors 30 and 31, the low side transistors 30 and 31 are turned on, and the current from the solenoid 38 can be flowed.

At this time, although the low side transistors 30 and 31 generate heat due to high power consumption, the temperature of the center part of the transistor is especially increases. In a case where the temperature detection circuit 11 detects the temperature and the temperature exceeds a certain threshold, to prevent breakdown of the transistor caused by the heat, the active clamp cutoff circuit 12 turns off only the low side transistor 31 in the center region. On the other hand, the low side transistor 30 on a non-center region is maintained to be turned on, and the current from the solenoid 38 is flowed. As a result, the maximum current of the solenoid 38 that is thermally broken down the low side transistors 30 and 31 can be increased.

Figure 9:
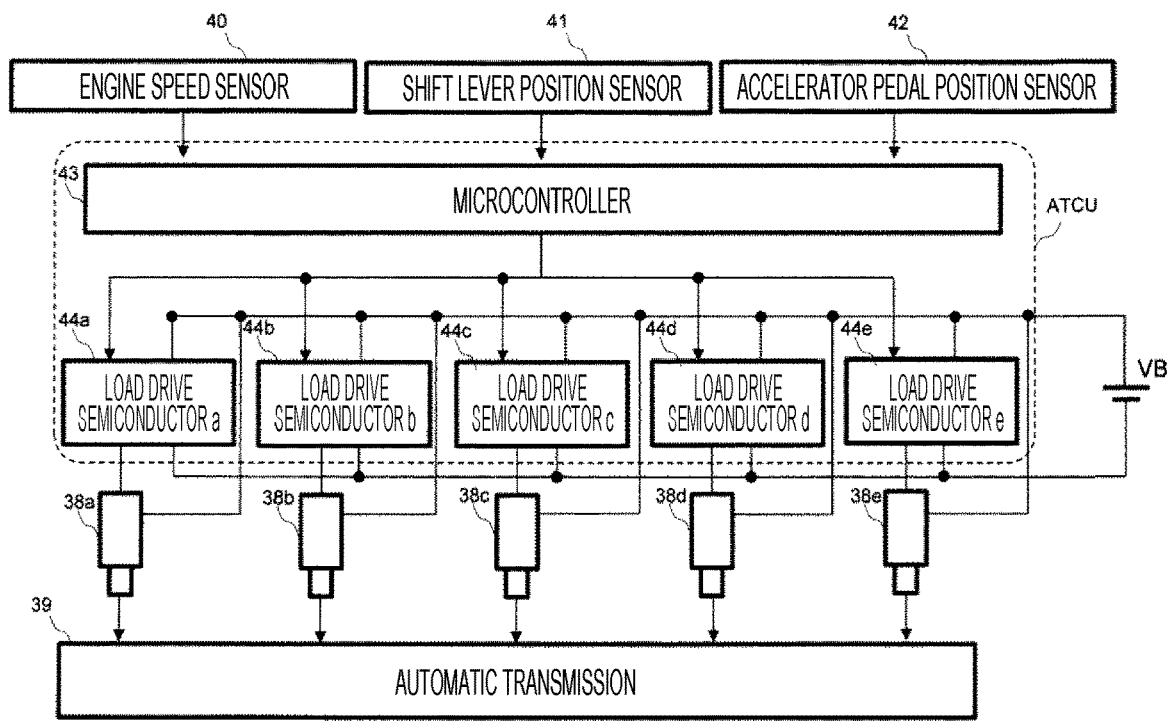
FIG. 9 is a configuration diagram of a device in which the fourth embodiment is used for an automatic transmission control ATCU.

FIG. 9 illustrates a configuration diagram of a device in a case where the load drive circuit 34 is used for an automatic transmission control unit ATCU (ATCU). The automatic transmission control ATCU includes load drive semiconductors 44a to 44e including the load drive circuit 34 and a microcontroller 43 which controls the load drive semiconductors 44a to 44e. The microcontroller 43 receives signals from sensors including an engine speed sensor 40, a shift lever position sensor 41, an accelerator pedal position sensor 42, and the like as inputs and calculates an optimum transmission gear ratio. The load drive semiconductors 44a to 44e respectively control currents of the solenoids 38a to 38e to hydraulically control a clutch in the transmission. Note that the controlled current flows from a battery VB to the load drive semiconductors 44a to 44e via the solenoids 38a to 38e.

As described above, according to the automatic transmission control ATCU according to the present embodiment, in the load dump state, the maximum current of the solenoid 38 which is thermally broken down by the low side transistors 30 and 31 can be increased.

The present invention is not limited to the embodiments described above and includes various modifications. For example, the embodiment has been described in detail for easy understanding of the present invention. The embodiment is not limited to those including all the components described above. Also, a part of the components of the embodiment can be replaced with that of the other embodiment, and the components of the embodiment can be added to the other embodiment. In addition, a part of the components of each embodiment can be deleted, replaced with that of the other embodiment, and a part of the other embodiment can be added to the components of the embodiment.

The embodiment of the present invention may be in the following mode.

(1) A semiconductor device which is a MOSFET which includes a semiconductor substrate and a plurality of transistors arranged in parallel on the semiconductor substrate, in which the MOSFET includes first-group transistors and second-group transistors, sources of the first-group transistors are electrically connected to sources of the second-group transistors, drains of the first-group transistors are electrically connected to drains of the second-group transistors, an active clamp circuit which turns on the MOSFET when the drain voltage exceeds a predetermined voltage is connected between gates and the drains of the first-group transistors, and an active clamp cutoff circuit is connected between gates of the second-group transistors and the active clamp cutoff circuit.

When the drain voltage of the MOSFET becomes equal to or higher than a clamp voltage, a current flows into the active clamp circuit, the current flows into a gate resistor of the MOSFET, and the gate voltage is increased, and accordingly, an active clamp state, in which the MOSFET is driven, is made. A temperature of the second-group transistors in the active clamp state is higher than a temperature of the first-group transistors. However, when a temperature of the MOSFET becomes equal to or higher than a predetermined temperature, the active clamp cutoff circuit is operated to electrically disconnect the gates of the second-group transistors and the active clamp circuit and brings only the second-group transistors into a nonconductive state.

With this configuration, while an increase in the temperature of the second-group transistors higher than the temperature of the first-group transistors is suppressed, it is possible to continuously drive the first-group transistors and absorb current energy. Therefore, uniformity of the temperatures of the transistors can be enhanced, and thermal breakdown energy of the transistor can be improved. Furthermore, since the gates of the first-group transistors and the second-group transistors are electrically connected to each other at the time of normal operation in a non-active clamp state, the thermal breakdown energy of the transistor and allowable energy not to exceed a rated temperature of the transistor can be increased without deteriorating current performance of the transistor per area. In addition, since the clamp voltage is constant, an active clamp time is not increased.

(2) A semiconductor device which is an IGBT which includes a semiconductor substrate and a plurality of transistors arranged in parallel on the semiconductor substrate, in which the IGBT includes first-group transistors and second-group transistors, emitters of the first-group transistors are electrically connected to emitters of the second-group transistors, collectors of the first-group transistors are electrically connected to collectors of the second-group transistors, an active clamp circuit which turns on the IGBT when a collector voltage exceeds a predetermined voltage is connected between gates and the collectors of the first-group transistors, and an active clamp cutoff circuit is connected between the gates of the second-group transistors and the active clamp cutoff circuit.

When the collector voltage of the IGBT becomes equal to or higher than a clamp voltage, a current flows into the active clamp circuit, the current flows a gate resistor of the IGBT, and the gate voltage is increased, and accordingly, an active clamp state, in which the IGBT is turned on, is made. A temperature of the second-group transistors in the active clamp state is higher than a temperature of the first-group transistors. However, when a temperature of the IGBT becomes equal to or higher than a predetermined temperature, the active clamp cutoff circuit is operated to electrically disconnect the gate of the second-group transistors and the active clamp circuit and brings only the second-group transistors into a nonconductive state.

With this configuration, while an increase in the temperature of the second-group transistors higher than the temperature of the first-group transistors is suppressed, it is possible to continuously drive the first-group transistors and absorb current energy. Therefore, uniformity of the temperatures of the transistors can be enhanced, and thermal breakdown energy of the transistor can be improved. Furthermore, since the gates of the first-group transistors and the second-group transistors are electrically connected to each other at the time of normal operation in a non-active clamp state, the thermal breakdown energy of the transistor and allowable energy not to exceed a rated temperature of the transistor can be increased without deteriorating current performance of the transistor per area. In addition, since the clamp voltage is constant, an active clamp time is not increased.

(3) The semiconductor device according to (1) and (2), in which the temperatures of the second-group transistors at the time of conducting the transistor is higher than the temperatures of the first-group transistors at the time of conducting the transistor.

(4) The semiconductor device according to (3), in which the second-group transistors include a transistor positioned in a center part of the MOSFET or the IGBT.

With this configuration, while an increase in the temperature of the transistor positioned in the center part where the temperature becomes the highest at the time of active clamp is suppressed, it is possible to continuously drive the transistors positioned in parts other than the center part and absorb current energy generated at an output terminal. Therefore, uniformity of the temperatures of the transistors can be enhanced, and thermal breakdown energy of the transistor can be improved. Furthermore, by suppressing the increase in the junction temperature of the center part of the transistor at the time of the active clamping operation and making temperature setting to detect excess temperature be closer to the maximum operation guarantee temperature, the transistor can be operated at a higher temperature.

(5) The semiconductor device according to (3) and (4), in which the active clamp cutoff circuit is connected to a temperature detection circuit which detects a junction temperature of the MOSFET or the IGBT, the active clamp cutoff circuit is operated when the junction temperature of the MOSFET or the IGBT detected by the temperature detection circuit exceeds a predetermined threshold, and the active clamp circuit and the gates of the second-group transistors are electrically disconnected.

(6) The semiconductor device according to (3) and (4), in which the active clamp cutoff circuit is connected to a temperature detection circuit which detects a junction temperature of the MOSFET or the IGBT, the active clamp cutoff circuit is operated when the junction temperature of the MOSFET or the IGBT detected by the temperature detection circuit exceeds a predetermined threshold, and the active clamp circuit and the gates of the second-group transistors are electrically connected via a resistance element.

(7) The semiconductor device according to (5) and (6), in which the temperature detection circuit includes a thermal diode arranged in or near the transistor and a comparator circuit which compares a voltage generated by the thermal diode with a reference voltage.

(8) The semiconductor device according to (3) and (4), in which the active clamp cutoff circuit is connected to an active clamp detection circuit which detects an active clamp state of the MOSFET or the IGBT.

With this configuration, when the active clamp state is detected, the active clamp cutoff circuit is operated, and a PMOS transistor is brought into a nonconductive state. As a result, the active clamp circuit and the gates of the second-group transistors are electrically connected to each other via the resistance element. As a result, the second-group transistors are brought into a nonconductive state, and the increase in the temperatures of the second-group transistors higher than the temperatures of the first-group transistors can be suppressed. Therefore, since the uniformity of the temperatures of the transistors can be enhanced, thermal breakdown energy of the transistor and allowable energy not to exceed a rated temperature of the transistor can be increased. Furthermore, by suppressing the increase in the junction temperature of the center part of the transistor at the time of the active clamping operation and making temperature setting to detect excess temperature be closer to the maximum operation guarantee temperature, the transistor can be operated at a higher temperature.

(9) The semiconductor device according to (5) to (7), in which the active clamp cutoff circuit includes a PMOS transistor.

With this configuration, when the temperature of the transistor becomes equal to or higher than a predetermined temperature, the active clamp cutoff circuit is operated, and the PMOS transistor is brought into a nonconductive state. As a result, the second-group transistors are brought into a nonconductive state, and the increase in the temperatures of the second-group transistors higher than the temperatures of the first-group transistors can be suppressed. Therefore, since the uniformity of the temperatures of the transistors can be enhanced, thermal breakdown energy of the transistor and allowable energy not to exceed a rated temperature of the transistor can be increased. Furthermore, by suppressing the increase in the junction temperature of the center part of the transistor at the time of the active clamping operation and making temperature setting to detect excess temperature be closer to the maximum operation guarantee temperature, the transistor can be operated at a higher temperature.

(10) The semiconductor device according to (6) and (7), in which the active clamp cutoff circuit includes a PMOS transistor and a resistance element connected to the PMOS transistor in parallel.

With this configuration, when the temperature of the transistor becomes equal to or higher than a predetermined temperature, the active clamp cutoff circuit is operated, and the PMOS transistor is brought into a nonconductive state. As a result, the active clamp circuit and the gates of the second-group transistors are electrically connected to each other via the resistance element. As a result, since gate voltages of the second-group transistors are smaller than gate voltages of the first-group transistors and a current density of the second-group transistors is suppressed to be small, an increase in the temperatures of the second-group transistors higher than the temperatures of the first-group transistors can be suppressed. Therefore, since the uniformity of the temperatures of the transistors can be enhanced, the thermal breakdown energy of the transistor and the allowable energy not to exceed a rated temperature of the transistor can be increased. Furthermore, by suppressing the increase in the junction temperature of the center part of the transistor at the time of the active clamping operation and making temperature setting to detect excess temperature be closer to the maximum operation guarantee temperature, the transistor can be operated at a higher temperature.

REFERENCE SIGNS LIST 1 power supply
2 electromagnetic load
3 input terminal
4 output terminal
5 ground terminal
6 load drive circuit
7 buffer
8 active clamp circuit
9, 10 gate resistor
11 temperature detection circuit
12 active clamp cutoff circuit
13 power transistor including MOSFETs in a non-center part
14 power transistor including MOSFETs in center part
15, 16 zener diode
17 reverse current blocking diode
18 gate (gate electrode)
19 source (source electrode)
20 drain (drain electrode)
21 PMOS transistor
22 thermal diode
23 current source
24 comparator
25 temperature detection circuit output
26 gate voltage reducing resistor
26A active clamp detection circuit (active clamp detection circuit)
27 comparator
28 determination voltage source (reference power supply)
29 power transistor
30 low side power transistor including MOSFETs in a non-center part (low side transistor)
31 low side power transistor including MOSFETs in center part (low side transistor)
32 high side power transistor (high side transistor)
33 gate resistor
34 load drive circuit
35 power supply terminal
36 low side input terminal
37 high side input terminal
38 solenoid
39 automatic transmission
40 engine speed sensor
41 shift lever position sensor
42 accelerator pedal position sensor
43 microcontroller
44 load drive semiconductor
P1, P2 connection point
R1, R2 path

The invention claimed is:

1. A semiconductor device comprising:
a first transistor including a first control electrode;
a second transistor connected to the first transistor in parallel and including a second control electrode;
an active clamp circuit configured to be provided in a first path from a first connection point between the first transistor and the second transistor to the first control electrode and to be conducted in a case where a voltage of the first connection point exceeds a first threshold; and
an active clamp cutoff circuit configured to be provided in a second path from the active clamp circuit to the second control electrode and to cut off or suppress a current flowing into the second path, wherein
the first control electrode and the second control electrode are gates.

2. The semiconductor device according to claim 1, further comprising:
a semiconductor substrate, wherein
the first transistor is formed in a first region on the semiconductor substrate, and
the second transistor is formed in a second region adjacent to the first region.

3. The semiconductor device according to claim 2, wherein
the first region includes two regions adjacent to the second region.

4. The semiconductor device according to claim 3, wherein
the second region is positioned in a center part of the semiconductor substrate.

5. The semiconductor device according to claim 1, further comprising:
a temperature detection circuit configured to detect a temperature of the second transistor, wherein
the active clamp cutoff circuit includes a third transistor which is turned on in a case where the temperature of the second transistor is equal to or lower than a second threshold and is turned off in a case where the temperature of the second transistor exceeds the second threshold.

6. The semiconductor device according to claim 5, wherein
the active clamp cutoff circuit includes a resistor connected to the third transistor in parallel.

7. The semiconductor device according to claim 1, further comprising:
an active clamp detection circuit configured to detect an active clamp state indicating a state where the active clamp circuit is conducted, wherein
the active clamp cutoff circuit includes a third transistor which is turned on in a case where the active clamp state is not detected and is turned off in a case where the active clamp state is detected.

8. The semiconductor device according to claim 4, wherein a temperature of the second transistor in a case where the second transistor is turned on is higher than a temperature of the first transistor in a case where the first transistor is turned on.

9. The semiconductor device according to claim 5, wherein the temperature detection circuit includes a thermal diode of which a forward voltage is decreased as a temperature increases and a comparator which compares the forward voltage of the thermal diode with a reference voltage.

10. The semiconductor device according to claim 2, wherein the first transistor includes first-group semiconductor elements arranged in parallel on the semiconductor substrate, the second transistor includes second-group semiconductor elements arranged in parallel on the semiconductor substrate, and the semiconductor element is a MOSFET or an IGBT.

11. The semiconductor device according to claim 1, further comprising:

a first resistor connected between a second connection point between the first transistor and the second transistor and the first control electrode; and a second resistor connected between the second connection point and the second control electrode.

\* \* \* \* \*